United States Patent [19]

Olbrechts

[11] 4,382,234
[45] May 3, 1983

[54] SLOW ACTING PHASE-LOCKED LOOP WITH EXTERNAL CONTROL SIGNAL

[75] Inventor: Guy R. Olbrechts, Bellevue, Wash.

[73] Assignee: The Boeing Company, Seattle, Wash.

[21] Appl. No.: 88,295

[22] Filed: Oct. 26, 1979

Related U.S. Application Data

[62] Division of Ser. No. 861,898, Dec. 19, 1977, Pat. No. 4,258,579.

[51] Int. Cl.³ .............................................. H03L 7/08
[52] U.S. Cl. ...................................... 331/10; 331/17; 331/27; 332/19
[58] Field of Search ..................................... 331/10–12, 331/17, 25, 27; 332/19, 30 V; 328/133, 134, 151

[56] References Cited

U.S. PATENT DOCUMENTS

| 3,414,842 | 12/1968 | Broadhead, Jr. ..................... 332/19 |
| 3,579,281 | 5/1971 | Kam et al. ......................... 332/30 V |
| 3,673,430 | 6/1972 | Donoghue ......................... 328/151 X |
| 4,009,455 | 2/1977 | Ishigaki et al. ..................... 332/19 X |
| 4,052,672 | 10/1977 | Enderby et al. ..................... 331/25 X |
| 4,068,181 | 1/1978 | Clark et al. ....................... 328/151 X |

Primary Examiner—Siegfried H. Grimm

Attorney, Agent, or Firm—Christensen, O'Connor, Johnson & Kindness

[57] ABSTRACT

A modulator for controlling the frequency of the power applied to a gyroscope to rotate the seismic mass (wheel) of the gyro so as to compensate for movement of the gyro case about the spin axis of the gyro is disclosed. The modulator includes a slow acting phase-locked loop that includes: a high frequency (e.g., 20 MHz) crystal controlled voltage controlled oscillator (VCXO); a divider for dividing the VCXO frequency down by several orders of magnitude (e.g., six); a phase comparator for comparing the relatively low frequency output of the divider with a low frequency reference signal; a loop filter for filtering the output of the phase comparator so as to give the loop its desired dynamic response chacteristic and bandwidth; and, a summing amplifier for summing the output of the phase comparator with a rate signal having a voltage level linearly related to the rate of movement of the gyro case about its spin axis. The rate signal is obtained from a second gyro mounted so as to sense movement about the spin axis of the gyro whose power frequency is being modulated. The power frequency control signal is derived from the output of the VCXO via a divider, which may form part of the divider of the slow acting phase-locked loop.

8 Claims, 4 Drawing Figures

SLOW ACTING PHASE-LOCKED LOOP WITH EXTERNAL CONTROL SIGNAL

This is a divisional of application Ser. No. 861,898, filed Dec. 19, 1977, and now U.S. Pat. No. 4,258,579.

BACKGROUND OF THE INVENTION

This invention is directed to gyroscopes and, more particularly, to control systems for controlling the rate of rotation of the spinning mass (wheel) of a gyroscope such that the spin rate remains constant in inertial space.

Gyroscopes are widely used in navigation and control systems to provide information about the rate of movement of a vehicle with which they are associated about three orthogonal axes, normally referred to as the yaw, roll and pitch axes. Depending upon the accuracy required, gyros vary from relatively inexpensive uncomplicated mechanisms to relatively expensive, complicated mechanisms. Regardless of their expense and complication, most presently available gyros include a spinning mass. In order for a gyro to provide accurate rate information, the rotational speed of the spinning mass (wheel) in inertial space must either be known very accurately in time or, preferably, held very constant at a known speed. In a typical gyro used in an aircraft inertial navigation system, for example, the gyro wheel forms the rotor of a synchronous motor. More specifically, an AC source connected to field coils mounted in the gyro case sets up a rotating field which is followed by the gyro wheel. As a result, the gyro wheel rotates at the same speed as the speed of movement of the rotating field. Stated another way, because a relative angular position between the rotor and the field is maintained and because the field rotates, the rotor rotates at the same speed as the field. Since the speed of the rotating field is relative to the field coils, which are mounted in the gyro case, and since the rotating field speed is proportional to the frequency of the AC source, if the frequency of the AC source is maintained highly stable at a known value, the speed of the gyro wheel is maintained at a highly stable known value in inertial space. This result, however, is only true if the gyro case does not rotate about its spin axis.

In inertial guidance and navigation systems that mount gyros on a platform, gyro case rotation about the gyro's spin axis is prevented because the position of the platform remains fixed in inertial space. This solution, however, cannot be used in a strapdown gyro system. In a strapdown gyro system, the gyro cases are attached to the body of a vehicle. As a result, the gyro spin axes are forced to follow the movements of the vehicle. Consequently, when the vehicle rotates about the spin axis of a particular gyro, the speed of the rotating magnetic field of the gyro no longer remains constant with respect to inertial space. Rather, the rotational motion of the vehicle about the spin axis of the gyro will either increase or decrease the speed of the magnetic field and, thus, the speed of the gyro wheel relative to inertial space.

Since vehicles move in a random fashion as a result of many external conditions, strapdown gyros rotate about their spin axes in a random manner. Because the movement is random, the static angular position and speed relationships between the spin vector of the gyro wheel and the rotating magnetic field vector vary in a random manner.

In the general case, the instantaneous magnitude of the spin vector of a gyro wheel is the sum of: (1) the appropriate component of the vehicle angular rate relative to inertial space (i.e., the rotational movement of the vehicle about the spin axis of the gyro); (2) the speed of the rotating field relative to the gyro case; and, (3) a varying factor which depends upon the inertia of the spinning mass and the "stiffness" of the motor (damping, etc.). The second term (relative speed of the rotating field), which is by far the largest of the three terms, can be kept highly constant by controlling the frequency of the AC source that causes the gyro wheel to spin, as discussed above. While the first and third term contributions to the instantaneous magnitude of the gyro wheel spin vector are substantially lower than the second term, they are high enough to create unacceptable errors in precision navigation systems, such as required on aircraft, if ignored. The first term (vehicle movement about the spin axis of the gyro) can be readily determined by mounting a second gyro such that it senses movement about the spin axis of the first gyro. Contrariwise, the third term is a highly dynamic term and its continuous measurement is extremely difficult.

In the past, various proposals have been made to overcome or eliminate the errors created by the first and third terms described above. These proposals can be grouped under two approaches. The first approach maintains the frequency of the gyro motor supply power constant and measures the first and third terms at frequent intervals. The measured data is then used to correct the rate data produced by the gyro. The second approach varies the frequency of the gyro motor AC power supply in such a way that the second term counteracts exactly the variations in field rotation speed caused by vehicle movements about the spin axis of the gyro. If this compensation is done correctly, the gyro wheel is not subject to angular accelerations and decelerations about its spin axis. As a result, the dynamic effects which create the third term vanish. In summary, the first approach measures the first and third terms and modifies the gyro rate data accordingly; and, the second approach modifies the wheel speed relative to the gyro case whereby the resulting data does not include errors caused by the first and third terms.

One proposal for implementing the first approach described above comprises mounting pins on the gyro wheel. The pins are used to induce pulses in a coil affixed to the gyro case. The time interval between pulses is measured and used to determine the time it takes for the wheel to make one complete revolution relative to the position of the coil, i.e., the measured time interval is used to determine wheel speed. These measurements are then used to form the basis for determining the third term. The first term, to an adequate degree of accuracy, is obtained from another gyro mounted so as to sense rotation about the spin axis of the gyro whose wheel induces pulses in the coil. The second term, of course, is known.

The problem with the foregoing proposal is that it is difficult to implement in practice. First, complex computations, which are time consuming, must be made. Second, it is very difficult if not impossible to obtain relative wheel speed data, with sufficient resolution and accuracy, and with a sufficiently small delay, at intervals which are frequent enough to satisfy the computation requirements. Even if obtainable, the circuitry necessary to obtain this information is complex and, therefore, expensive. In this regard, mounting more than one pin about the circumference of the wheel and measuring the time interval between the consecutive pulses produced by a fixed coil so as to determine wheel speed based on measuring only a fraction of revolution cannot be done accurately enough. Such measurements cannot be made accurately enough because the pins cannot be positioned accurately enough. As a result, only the time between pulses induced by the same pin can be used. However, measuring the time needed for a full revolution to occur cannot, in a practical way, be done such that the necessary resolution is achieved. In this regard, in order to meet accurate navigation requirements, revolution measurements must be taken such that a resolution of one part in 800,000 or better is achieved. A typical navigation gyro wheel makes 100 revolutions per second. Consequently, the measurement of a single revolution with a resolution of one part in 800,000 requires an 80 MHz counter setup. An 80 MHz counter requires corresponding very fast reading and reset circuitry and is complex and expensive. Furthermore, only an average value over a full revolution is obtained. While several counters, each started at different, staggered times, could be used to produce wheel speed information that is recent enough, such an arrangement still produces only an average value over a full revolution. Further, such an arrangement is expensive due to the inclusion of several counters and their related subsystems.

In view of the foregoing discussion, it will be readily appreciated that prior art proposals to keep the frequency of the gyro power supply constant and measure data sufficient for the first and third terms to be determined are generally unsatisfactory. Not only is the equipment needed to make the required measurements difficult to design, such equipment is substantially more expensive than desirable.

Prior proposals for implementing the second approach generally described above, i.e., modulating the frequency of the gyro motor AC power supply in such a way that the second term counteracts exactly the variations in field rotational speed (in inertial space) about the gyro spin axis caused by vehicle movements, have also been generally unsatisfactory. In this regard, one prior proposal for implementing the second approach includes a phase-lock loop. A divider connected between the output of the phase-locked loop signal source and the phase comparator of the phase-locked loop has a modulus (division factor) that is controlled by the angular rate signal derived from a gyro mounted so as to detect vehicular movement about the rotational axis of the gyro whose wheel speed is being modulated. The division factor varies by a factor δ from a nominal value m.

A major problem with this implementation is that it is impossible, in a practical system, to obtain wheel speed values having sufficient resolution for them to be usable in a fast response phase-locked loop of this type. In this regard, wheel speed resolution is given by the equation $1/(m+\delta)$. If it is assumed that the wheel rotates at 100 revolutions per second (36,000°/sec) and that vehicle rates up to ±10°/second must be compensated for, δ will be very small compared to m. As a result, wheel speed resolution is essentially equal to $1/m$. As noted above, a resolution equal to one part in 800,000 or better must be obtained. Hence, m must be equal to 800,000 or more. As will be readily understood by those familiar with phase-locked loops, the frequency level of the output of phase-locked loop signal source (such as a voltage controlled oscillator) must be equal to m (the divider value) times the frequency level of a reference signal for lock to be achieved. The reference signal is externally produced and is compared with the frequency divided down signal produced by the loop signal source is a phase comparator. The result of the comparison is used to control the frequency of the loop signal source so that the loop becomes locked. At the present time crystal controlled voltage controlled oscillators produce signals that are stable up to the 20 MHz range. As will be readily appreciated by those skilled in the art, the implementation of variable modulus counters above 20 MHz is very difficult. As a result, signal sources having frequency values above this range are generally unusable. Now if the foregoing resolution requirement (one part in 800,000) is applied and the 20 MHz limitation is met, the reference frequency must have a value of 25 Hz, or less (20 MHz/800,000=25 Hz). This resulting low reference frequency value means that the phase-locked loop will be slow acting, unless some highly complex phase comparator is used. The phase-locked loop is slow acting, of course, because the variable inputs of the phase comparator can only be updated 25 times per second at most. The end result is that a loop with a bandwidth well below 1 Hz must be used; otherwise, limit cycling, excessive VCXO modulation due to the reference frequency component of the control signal and other undesirable effects will occur. Because the loop filter bandwidth is below 1 Hz, this arrangement will only be able to compensate accurately for vehicle rate signals whose frequency spectrum does not exceed a small fraction of a Hz. While this limitation may be acceptable in some environments, it is not acceptable in other environments, such as an aircraft environment, where gyro case frequency components of 5 to 20 Hz and above occur and must be compensated for. In this regard, it should be noted that above these frequencies, the inertia of the wheel will keep its speed in inertial space constant because the third term cancels out the first term. Hence, it is frequencies below 5-20 Hz (down to about 1/10 Hz) that must be compensated for by modulating the wheel speed of the gyro. With the physical limitations of practical systems noted above, such compensation cannot be accomplished using the foregoing implementation of the second approach.

In summary, implementations of neither of the proposed approaches discussed above is satisfactory. While the present invention falls generally within the second approach described above, it implements that approach in a manner substantially different than the manner described above. As will be better understood from the following discussion, the invention avoids the results of the latter implementation, whereby it is useful in environments wherein gyro case frequency components lie substantially beyond the passband of the loop filter of the phase lock loop.

SUMMARY OF THE INVENTION

In accordance with this invention, a slow acting phase-locked loop is provided. The slow acting phase-locked loop includes: high frequency signal source, such as a crystal controlled voltage controlled oscillator (VCXO), that has a very narrow frequency band; and, a fixed divider for dividing the output of the VCXO down by several orders of magnitude. The relatively low frequency output of the divider is compared with a low frequency reference signal in a phase comparator. The output of the phase comparator is connected to one input of a summer via a loop filter which, together with the large amount of frequency division, gives the loop a slow response. The second input of the summer is connected to receive a control signal. As a result of this arrangement, i.e., the control signal not being required to pass through the loop filter and the frequency divider, control signals having frequencies well in excess of the frequency limits set by the loop filter and frequency divider combined can be utilized to vary, on a short term basis, the frequency of the VCXO signal over its narrow band. Since the loop is very slow acting (e.g., 1/300 Hz), the output of the VCXO is not rapidly washed out by the loop filter. The power frequency control signal is, of course, derived from the output of the VCXO. Either the VCXO output can be used directly (via a suitable divider) or the output of a particular stage of the divider forming a part of the phase-locked loop can be utilized, as desired.

In a preferred embodiment of the invention, the VCXO produces an output over a limited range lying in the MHz band. The loop divider divides the MHz output down to the Hz band and the reference frequency lies in the Hz band. Also, preferably, the loop bandwidth has a cutoff frequency substantially below one (1) Hz.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENT

Figure 1:
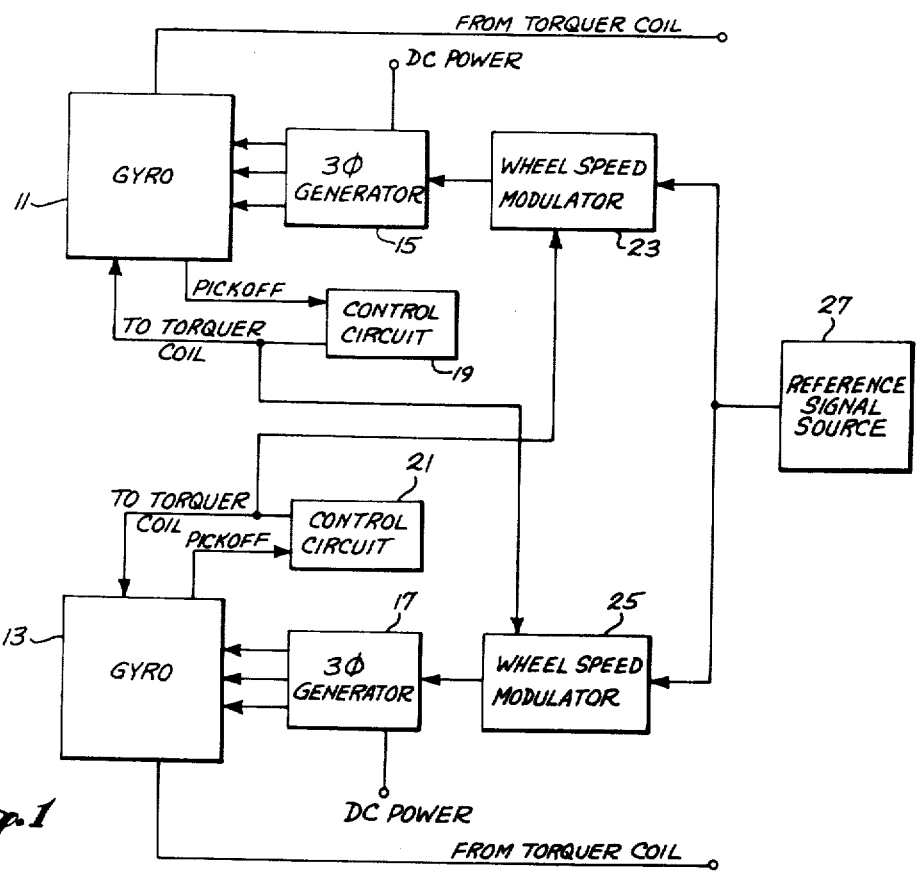
FIG. 1 is a block diagram of a gyroscope system including wheel speed modulators formed in accordance with the invention.

In order for the invention to be more readily understood, prior to describing a preferred embodiment of a wheel speed modulator including a slow acting phase-locked loop formed in accordance with the invention, a description of a gyroscope system in which a wheel speed modulator including a slow acting phase-locked loop formed in accordance with the invention is useful is set forth. In this regard, attention is directed to FIG. 1. FIG. 1 illustrates first and second strapdown gyros 11 and 13. By strapdown, is meant that the cases of the gyros are affixed to the vehicle in which the gyroscopes are mounted. For purposes of discussion only, the gyros are denoted as single-degree-of-freedom gyros with the sense axis of each gyro oriented so as to sense rotational movement about the spin axis of the other gyro. In other words, the second gyro 13 has its sense axis mounted so as to sense rotational movement about the spin axis of the first gyro 11; and, the sense axis of the first gyro 11 is mounted so as to sense rotational movement about the spin axis of the second gyro 13. As will be readily apreciated by those skilled in this art and others, of course, each of the gyros could be two-degree-of-freedom gyros, i.e., gyros that sense rotational movement about two orthogonal (X-Y) axes. If so, one of the sensing axes of one of the gyros will be mounted so as to sense movement about the spin axis of the other gyro and vice versa.

The gyroscope system illustrated in FIG. 1 also includes: first and second three-phase (30) generators 15 and 17; first and second gyro control circuits 19 and 21; first and second wheel speed modulators 23 and 25; and, a reference signal source 27.

The first three-phase generator 15 powers the first gyro 11 in a conventional manner with AC power. The frequency of the power produced by the first three-phase generator 15 is controlled by the first wheel speed modulator 23. In addition, the first three-phase generator receives power from a suitable DC power source. Similaly, the second three-phase generator 17 receives power from a suitable DC power source and powers the second gyro 13. The frequency of the power produced by the second three-phase generator is controlled by the second wheel speed modulator 25.

The first control circuit 19 receives a signal from the pickoff coil of the first gyro 11 and, in accordance therewith, applies power to the compensating torquer coil of the first gyro 11. That is, when rotational movement occurs about the sense axis of the first gyro, such movement modulates a pickoff coil signal. The modulated pickoff coil signal is amplified by a suitable pickoff amplifier and applied to the control circuit 19. The control circuit demodulates the pickoff coil signal and, in accordance therewith, via a power amplifier and other well-known servo loop circuitry, controls the value of a torquer coil current that is applied to the torquer coils of the first gyro 11. The torquer coil current is adequate to maintain the seismic mass of the gyro in its normal position. The torquer coil current level is linearly related to the rate of rotational movement and is applied to suitable downstream circuitry. Similarly, the second control circuit 21 receives a modulated signal from the pickoff coil of the second gyro 13 when rotational movement occurs about the sense axis of the second gyro and applies a torquer coil current to the torquer coils of the second gyro 13.

The signal applied to the torquer coils of the second gyro 13 is also applied to the first wheel speed modulator 23. And, correspondingly, the signal applied to the torquer coils of the first gyro 11 is applied to the second wheel speed modulator 25. In addition, the first and second wheel speed modulators receive a reference signal from the reference signal source 27.

The reference signal source is a highly stable signal source. The frequency of the reference signal controls the speed of rotation of the seismic mass (wheel) of the gyros via the first and second wheel speed modulators 23 and 25. As long as no rotation is sensed about the spin axis of the gyros, the reference signal maintains the speed of rotation of the gyro wheels constant. When rotation about the spin axis of one gyro is sensed by the other gyro, the reference signal frequency is modulated by the wheel speed modulator, i.e., the frequency is increased or decreased by a slight amount. The frequency change exactly compensates for the rotation of the case of the gyro about its spin axis. In this manner, compensation is provided for rotational movement of the case about its spin axis, whereby the speed of rotation of the wheel of the gyro whose case is rotating remains fixed in inertial space. More specifically, the frequency of the related three-phase generator signal is modulated in such a way that the speed of rotation of the gyro wheel relative to the case varies so as to exactly counteract the variation in the rotation of the field (in inertial space), about the gyro spin axis caused by vehicle movements. Consequently, the gyro wheel is not subject to angular accerlerations and decelerations about its spin axis, whereby the dynamic effects, which create the third term (discussed above) of the series of terms that define the instantaneous magnitude of the spin vector of the gyro wheel, are eliminated.

Figure 2:
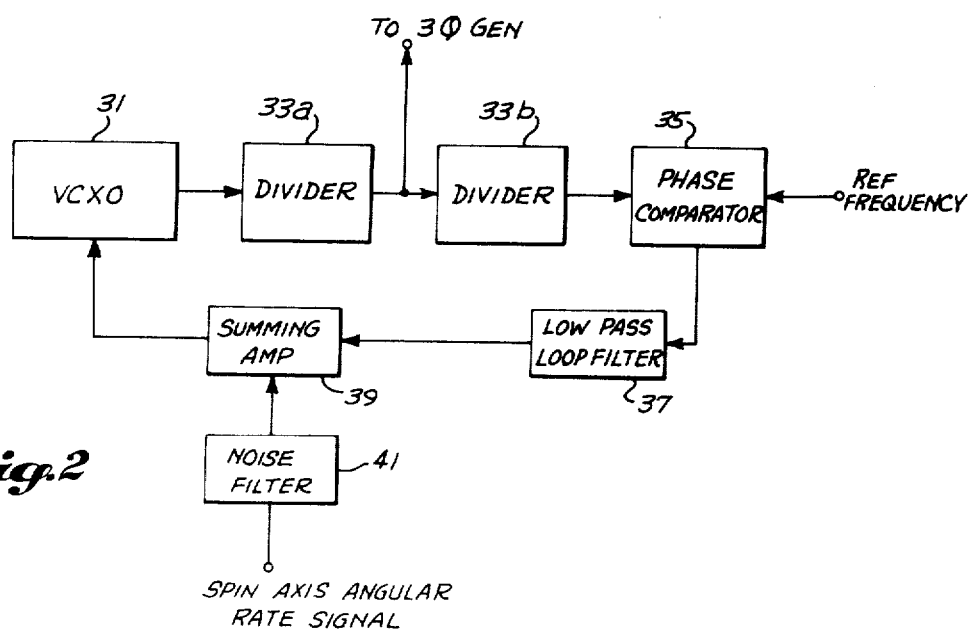
FIG. 2 is a generalized block diagram of a wheel speed modulator formed in accordance with the invention.

FIG. 2 is a generalized block diagram illustrating a wheel speed modulator including a slow acting phase locked loop formed in accordance with the invention and comprises: a crystal controlled voltage controlled oscillator (VCXO) 31; first and second fixed modulus dividers 33a and 33b; a phase comparator 35; a low pass loop filter 37; a summing amplifier 39; and, a noise filter 41. As will be readily appreciated by those skilled in the oscillator art, a VCXO is a high frequency (e.g., 20 MHz) oscillator whose frequency can be varied slightly about a nominal frequency, i.e., the VCXO is a narrow band ($\pm 0.1\%$ about a nominal value) oscillator.

The output of the VCXO is connected to the input of the first divider 33a. The output of the first divider 33a is connected to the input of the second divider 33b and to the frequency control input of the three-phase generator whose output power frequency is to be controlled. Obviously, these connections are exemplary. That is, the output of the VCXO 31 could be applied via one or more other dividers to the input of the three-phase generator and the two dividers 33a and 33b could comprise a single divider; or, a multitude of dividers. In this regard, in a practical embodiment of the invention, several physical dividers are necessary because the output of the VCXO is divided down by several orders of magnitude. Preferably, a 20 MHz nominal VCXO signal is divided down to a nominal 20 Hz signal by dividers having a combined division modulus of $10^6$. In any event, the output of the second divider 33b is connected to one input of the phase comparator 35. The other input of the phase comparator is connected to receive the reference frequency signal, which is designated $f_{REF}$. The output of the phase comparator 35 is connected through the low pass loop filter 37 to one input of the summing amplifier 39. The angular rate signal obtained from the other gyro is connected through the noise filter 41 to the second input of the summing amplifier 39. The output of the summing amplifier 39 is connected to the voltage control input of the VCXO 31.

It will be appreciated from the foregoing description that the control voltage applied to the VCXO is the sum of the low pass loop filter signal and the angular rate signal derived from the other gyro, i.e., the gyro having a sense axis positioned so as to sense movement about the spin axis of the gyro whose power frequency is being controlled.

The low pass loop filter is formed such that the phase-locked loop is a second order loop. Preferably, the loop passes only signals substantially below one (1) Hz. In fact, preferably, the cutoff frequency of the loop is around 1/300 Hz. In any event, the constants of the loop are dimensioned in such a way that the loop reacts very slowly to changes in the output of the VCXO caused by the spin axis angular rate signal.

If the spin axis angular rate signal has been constant for an adequate period of time, the loop will be stable, whereby the frequency of the VCXO signal will have a value equal to the division factor (m) of the first and second dividers 33a and 33b times $f_{REF}$, i.e., $f_{VCXO} = m \cdot f_{REF}$. When the vehicle to which the case of the gyro is attached rotates, the spin axis angular rate signal will modulate the frequency of the VCXO signal. For relatively rapid changes in the spin axis angular rate signal, the slow acting loop will not have time to wash out the effect of the spin axis angular rate signal on the frequency of the VCXO signal. If a VCXO having a linear control law is used ($f_{VCXO} = KV_c$), the output of the second divider 33a will vary in such a way that a spin axis angular rate having a frequency level adequately above the passband of the low pass loop filter 37 will be cancelled. Assuming that the gyro wheel speed is 100 revolutions per second or 36000° per second, and that the angular rate is 10° per second, the modulation is $\pm 0.03\%$ ($10/36000 = 0.0003 = 0.03\%$), well within the $\pm 0.1\%$ available frequency band of a VCXO. (10°/sec = 10 Hz angular rate signal.)

It should be noted that the fact that low frequency spin axis angular rates are not compensated does not present a problem because frequency components below about 1/10 Hz do not impair navigational accuracy if left uncompensated. On the other hand spin axis angular rates above about 1/10 Hz, which do effect navigational accuracy, are compensated for quite accurately. The frequency limit of the invention is actually determined by the passband of the noise filter 41. This filter is required to keep high-frequency noise signals away from the VCXO input. Preferably, the cutoff frequency of this filter (which may comprise a series of filters) is about 40 Hz. Alternatively, the noise filter can be designed to reject particular components of the spin axis angular rate signal known to be produced by the gyro producing the spin axis angular rate signal, as hereinafter described with respect to FIG. 3. In any event, spin axis angular rate changes above 40 Hz do not need compensation because the inertia of the wheel makes rate compensation unnecessary above 40 Hz.

It will be appreciated that the invention relies on the fact that no appreciable DC component is present in the angular rate signals, because DC components are washed out by the phase-locked loop. In most applications, particularly aircraft applications, this assumption is true because the vehicle (aircraft) never sustains an appreciable angular rate in the same direction over an appreciable length of time. In this regard, an appreciable angular rate would mean that a large angular displacement of the vehicle has taken place. Even after a relatively long flight, the total angular displacement of an aircraft is small, especially along the pitch and roll axes.

Because a phase-locked loop is used to stabilize the nominal frequency of the VCXO, the invention provides a very accurate wheel speed control system. The system operates over a wide temperature range without temperature compensation or regulation. Not only is the nominal wheel speed accurate, the modulation of the nominal frequency of the VCXO is accurate over the range of modulating signals where accuracy is needed. In this regard, a VCXO with a control law that is linear within $\pm 2$ percent should be used. Further, because a slow-acting, phase-locked loop is provided, it is important that the frequency source (VCXO) have good inherent short-term frequency stability. If this condition is not met, the loop will not keep up with changes induced by the frequency source. Further, it is important that the frequency source be prevented from reaching values too far removed from its useful range. In this regard, if such values are obtainable, the loop will become unlocked. Because the loop is very slow acting, a substantial period of time will elapse before a locked condition is re-achieved. These reasons dictate why a crystal controlled voltage controlled oscillator (VCXO), having a frequency band of ±0.1%, is preferred. Obviously, other frequency sources that meet these criteria can be used, if desired.

As will also be appreciated by those skilled in the art, a slow-acting, phase-locked loop allows considerable phase-signal differences to build up at the input of the phase comparator before a transient, such as a spin axis angular rate signal is washed out. As a result, the circuit parameters (particularly the reference frequency) must be chosen such that the worst case transient cannot overload the phase comparator. If this condition is not met, the loop will become unlocked and go into a search mode. As a result, a relatively long period of time may elapse before accurate operation is restored.

Figure 3:
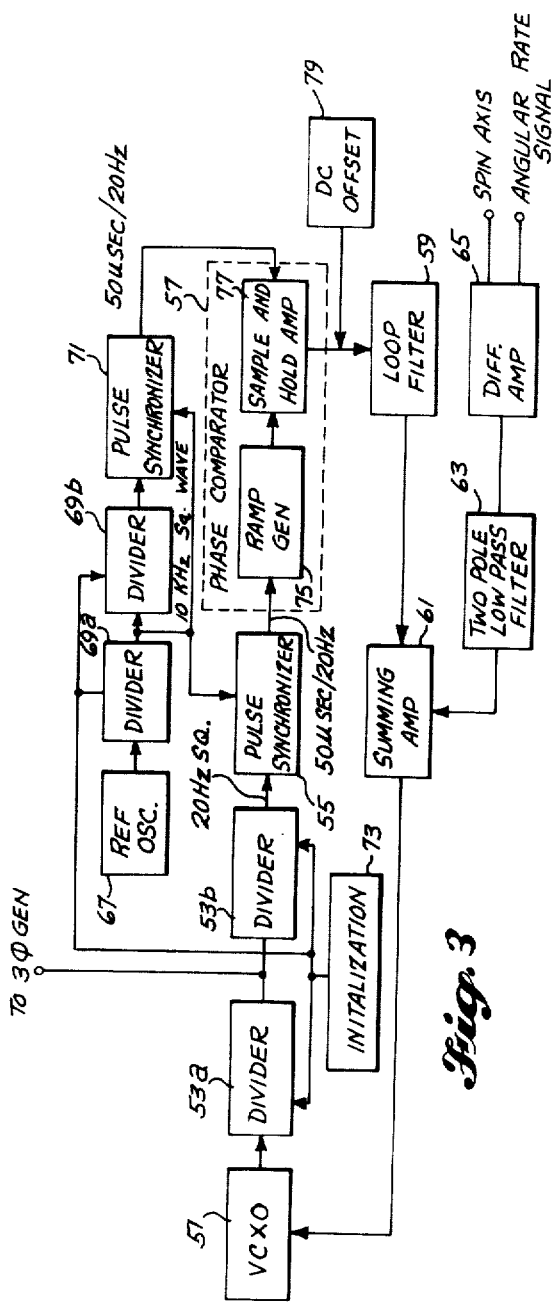
FIG. 3 is a detailed block diagram of a gyroscope wheel speed modulator formed in accordance with the invention; and, FIG. 4 is a series of waveforms utilized to describe the gyroscope wheel speed modulator illustrated in FIG. 3.

FIG. 3 is a block diagram illustrating in more detail a preferred embodiment of a wheel speed modulator formed in accordance with the invention. The gyroscope wheel speed modulator illustrated in FIG. 3 comprises: a VCXO 51; first and second loop dividers 53a and 53b; a loop pulse synchronizer 55; a phase comparator 57; a loop filter 59; a summing amplifier 61; a two-pole low pass filter 63; a differential amplifier 65; a reference oscillator 67; first and second reference dividers 69a and 69b; a reference pulse synchronizer 71; and an initialization circuit 73. The phase comparator 57 comprises: a ramp generator 75; and, a sample and hold amplifier 77. Preferably, the VCXO produces a signal having a nominal frequency of known value such as 19,660,800 Hz and the reference oscillator 67 produces a stable high-frequency signal having a known value such as 10 MHz.

The output of the VCXO 51 is connected to the input of the first loop divider 53a. Preferably the first loop divider (which may comprise a series of divider stages) divides the nominal frequency of the VCXO 19,660,800 Hz) by 8192. As a result, the frequency of the output of the first loop divider 53a (at the VCXO nominal frequency) is 2,400 Hz. This signal is applied to the three-phase generator and to the input of the second loop divider 53b.

Figure 4:
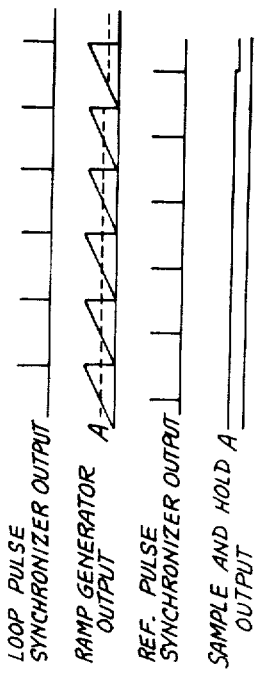

Preferably, the second loop divider 53b has a division factor of 120, whereby the frequency of the output of the second loop divider 53b (at the nominal frequency of the VCXO) is 20 Hz. This signal is applied to one input of the loop pulse synchronizer 55. The loop pulse synchronizer 55 also receives a clock pulse chain derived from the reference oscillator 67 in the manner hereinafter described. Preferably, the frequency of the clock pulse chain is 10 KHz. As a result, the output of the loop pulse synchronizer is a pulse train of 50 microsecond pulses having a nominal 20 Hz repetition rate (each pulse occurs at the leading edge of the 20 Hz input), as shown on the first line of FIG. 4. These pulses are applied to one input of the phase comparator 57. More specifically, the output of the loop pulse synchronizer 55 is applied to the input of the ramp generator 75. The ramp generator 75 is controlled by these pulses such that a new ramp signal is started each time a 50 microsecond pulse occurs, as denoted by the second line of FIG. 4. The output of the ramp generator is connected to the signal input of the sample and hold amplifier 77.

The output of the reference oscillator 67 is connected through the first and second reference dividers 69a and 69b to the reference pulse synchronizer 71. The output of the first reference divider 69a is the 10 KHz clock pulse train applied to the loop pulse synchronizer 55. This same pulse train is applied to the reference pulse synchronizer 71. With respect to particular division factors, assuming the referenced oscillator is producing a signal at 10 MHz, the first divider divides the output of reference oscillator by 1,000 to produce the 10 KHz clock pulse train. The second divider divides the 10 KHz signal by 500 so as to produce a 20 Hz output. As a result, the output of the second pulse synchronizer 71 is a series of 50 microsecond pulses at a highly accurate 20 Hz rate. This pulse train forms the reference signal that is applied to the phase comparator 57. More specifically, the output of the reference pulse synchronizer 71 is connected to the control input of the sample and hold amplifier 77.

The operation of the phase comparator is next described. The pulse chain produced by the loop pulse synchronizer 55, as previously noted, causes a new ramp signal to start each time a pulse occurs. The sample and hold amplifier is commanded to sample by the 50 microsecond pulse outputs of the reference pulse synchronizer 71. In a conventional manner, the sample and hold amplifier samples its signal input during the 50 microsecond pulse periods and holds each sampled value until it is next commanded to sample. As long as the input is the same each time the sample and hold amplifier samples its signal input, its output remains constant.

Assuming first that the frequency of the pulse chain produced by the first pulse synchronizer 55 remains constant (which occurs when no case movement about the spin axis is sensed), the sample and hold amplifier will sample the ramp output of the ramp generator at a fixed point with respect to the start of a ramp, each time the sample and hold amplifier is enabled by the output of the reference pulse synchronizer 71. This output is illustrated on the left side of FIG. 4. When the output of the VCXO changes in the manner hereinafter described, the pulse output of the loop pulse synchronizer will change position in time, as illustrated in exemplary manner by the fifth pulse in the first line of FIG. 4. As a result, the next ramp starts at a different point in time. Because the pulses produced by the reference pulse synchronizer 71 are fixed in time, the sample and hold amplifier samples at a different point in the ramp. Thus, the output of the sample and hold amplifier changes. Hence, a VCXO frequency change causes a change in the output of the sample and hold amplifier 77, which output represents the phase difference between the phase comparator inputs.

The output of the sample and hold amplifier is combined with a DC offset signal, produced by a DC offset source 79. The combined signal is applied through the loop filter 59 to one input of the summing amplifier 61. The spin axis angular rate signal derived from the other gyroscope is applied to the differential amplifier 65. The output of the differential amplifier is applied through the two-pole low pass filter 63 to the second input of the summing amplifier 61. The output of the summing amplifier 61 is applied to the voltage control input of the VCXO 51.

In operation, a spin axis angular rate signal denoting movement about the spin axis of the gyro whose wheel speed is being controlled causes the frequency of the output of the VCXO to change. This change causes a change in the output of the sample-and-hold amplifier as previously described. The sample-and-hold amplifier change tends to cause the output of the VCXO to return to its nominal frequency. However, because the loop is slow acting, the VCXO does not return to its nominal frequency via this route (i.e., the spin axis angular rate signal is not washed out) prior to the spin axis angular rate signal ending (or changing to a different value).

The output voltage of the sample and hold amplifier contains a very low 20 Hz component. The use of a phase comparator with a low reference frequency ripple content in its output is significant. Specifically, if a comparator that required heavy filtering in the loop filter were used because the phase comparator signal contained a very high reference-frequency ripple, excessive phase-shift would be introduced. Such phase-shift would destroy the effective operation of the invention.

The loop filter is dimensioned in such a way (taking other circuit parameters, particularly the division factors of the first and second loop dividers 53a and 53b, into account) that a second order loop with a 1/300 Hz cutoff frequency is provided. Preferably, the second order loop has a damping coefficient of 0.7 and, as noted, a cutoff frequency in the order of 1/300 Hz or less. (It should be noted that a cutoff frequency below 1/1000 could produce unacceptable drift.) The DC offset is added to the phase comparator output in order to center its operating range about zero (it extends from $-\pi$ to $+\pi$ radians). The differential amplifier eliminates common mode effects and the two-pole low pass filter eliminates noise. The two poles of the two-pole low pass filter are centered at multiples of the wheel spin frequency of the other gyro so as to eliminate noise which is known to occur at those frequencies. The initialization circuit 73, which is connected to all of the dividers, presets the dividers such that the correct phase-relationship occurs at the output of the comparator for a steady state condition (fixed angular rate input). As a result of the inclusion of an initialization circuit, the loop does not have to go through a big transient at turn-on and the frequency of the VCXO signal is immediately close to its nominal value. This allows the system to be useful as soon as the gyro wheel speed is up to its synchronous speed.

The loop parameters (especially the reference frequency) are chosen in such a way that a worst-case transient rate signal cannot overload the phase-comparator. As a result, long unlocked time periods are eliminated and linear operation is maintained. In this regard, the wheel speed modulator parameters should comply with the following equation:

$$360 \, K_1 K_2 K_3 K_4 = 1$$

where:

$K_1$ = scaling of the spin axis angular rate signal in volts/°/sec;

$K_2$ = total amplification of the spin axis angular rate signal between the sensing gyro and the input of the VCXO;

$K_3$ = relative change in the frequency of the VCXO output in terms of input voltage expressed in volts; and, $K_4$ = number of revolutions per second of the gyro wheel.

A suitable VCXO is the model CO-271V sold by the Vectron Corporation, Norwalk, Conn. Such a VCXO, used in an actual embodiment of the invention, had: a frequency deviation of ±0.03%; linearity of 1%; a frequency stability between 0° and 50° C. of ±0.001%.

It is pointed out that a mathematical analysis of a particular circuit has shown that the slowness of the loop is not due to the loop filter but rather to the frequency division of the VCXO signal. In fact the loop filter amplifies 20 Hz components in the output of the sample and hold amplifier, rather than attenuating them. This result adds to the need for a ripple-free phase-comparator. As will be readily understood by those skilled in the art, many phase-comparators do not meet this requirement.

While a preferred embodiment of the invention has been illustrated and described, it will be appreciated that various changes can be made therein without departing from the spirit and scope of the invention. For example, a phase-comparator other than a phase comparator comprising a ramp generator and a sample and hold amplifier can be utilized, if desired, as long as the phase comparator provides a generally ripple free output. Moreover, various frequencies, other than those specifically denoted above can be utilized, as desired. In essence, the invention requires a slow-acting phase-locked loop whose control signal is combined with a spin axis angular rate signal having a frequency substantially above the loop frequency immediately prior to the combined control signal being applied to a narrow band signal source. While the invention has been described in conjunction with gyro systems, which form the environment within which it was developed, it is to be understood that the invention may also find use in other environments wherein a control signal having a frequency beyond the loop frequency is used to control the frequency of the loop signal source on a short term basis. Consequently, the invention can be practiced otherwise than as specifically described herein.

The embodiments of the invention in which an exclusive property or privilege is claimed are defined as follows:

1. A slow acting phase-locked loop adapted to vary the frequency of an output signal in response to control signals having frequency components well above the cut-off frequency of said slow acting phase-locked loop, said slow acting phase-locked loop comprising:

controllable oscillator means for producing a high frequency oscillator signal in response to an oscillation control signal, said controllable oscillator having a linear frequency control law over a very narrow frequency band lying about a nominal high frequency;

divider means connected to said oscillator means for dividing down the frequency of said oscillator signal to produce a low frequency loop signal having a frequency several orders of magnitude lower than the frequency of said high frequency oscillator signal and an output signal having a frequency lying in the range between said high frequency oscillator signal and said low frequency loop signal;

reference signal means for producing a highly accurate and stable low frequency control signal having a frequency the same as the frequency of said low frequency loop signal;

phase comparator means connected to said divider means and to said reference signal means for: (i) receiving said low frequency loop signal produced by said divider means and said highly accurate and stable low frequency control signal produced by said reference signal means; (ii) comparing said low frequency loop signal produced by said divider means and said highly accurate and stable low frequency control signal produced by said reference signal means; and, (iii) producing, in accordance therewith, a loop control signal having a very low magnitude ripple at the frequency of said low frequency control and loop signals and an overall magnitude related to the phase difference between said low frequency loop signal produced by said divider means and said highly accurate and stable low frequency control signal produced by said reference signal means;

loop filter means connected to said phase comparator means for receiving and low frequency filtering in a low phase shift manner said loop control signal; and, summing means having a first input connected to receive the output of said loop filter means and a second input adapted to receive an external control signal having a frequency component lying above the cutoff frequency of said slow acting phase-locked loop, said summing means summing its input signals and producing an oscillator control signal in accordance therewith, said oscillator control signal applied to said controllable oscillator means for controlling the frequency of the high frequency oscillator signal produced by said controllable oscillator means.

2. A slow acting phase-locked loop as claimed in claim 1 wherein:
the high frequency oscillator signal frequency is in the MHz band;
the low frequency loop signal frequency is in the Hz band; and,
the highly accurate and stable low frequency control signal frequency is in the Hz band.

3. A slow acting phase-locked loop as claimed in claim 2 wherein the cutoff frequency of said loop filter means and the division factor of the divider means are such that the bandwidth of said slow acting phase-locked loop is substantially below 1 Hz.

4. A slow acting phase-locked loop as claimed in claim 1 wherein said oscillator means is a crystal controlled voltage controlled oscillator.

5. A slow acting phase-locked loop as claimed in claim 4 wherein:
the high frequency oscillator signal frequency is in the MHz band;
the low frequency loop signal frequency is in the Hz band; and,
the highly accurate and stable low frequency control signal frequency is in the Hz band.

6. A slow acting phase-locked loop as claimed in claim 1 wherein the frequency of the low frequency loop signal and the frequency of said highly accurate and stable low frequency control signal are in the Hz band.

7. A slow acting phase-locked loop as claimed in claim 1 wherein said highly accurate and stable low frequency control signal and said low frequency loop signal are a series of short duration pulses.

8. A slow acting phase-locked loop as claimed in claim 7 wherein said phase comparator means comprises:
a ramp generator connected to receive said low frequency loop signal and produce a series of ramp signals, each of said ramp signals being initiated upon the receipt of one of said short duration pulses forming said low frequency loop signal; and,
a sample and hold circuit having its signal input connected to the output of said ramp generator and its sample command input connected to receive and be enabled by the series of short duration pulses forming said highly accurate and stable low frequency control signal, the output of said sample and hold circuit connected to the input of said loop filter means.

* * * * *